United States Patent [19]

Cathey, Jr. et al.

[11] Patent Number: 5,766,829
[45] Date of Patent: Jun. 16, 1998

[54] METHOD OF PHASE SHIFT LITHOGRAPHY

[75] Inventors: David A. Cathey, Jr.; J. Brett Rolfson, both of Boise, Id.

[73] Assignee: Micron Technology, Inc., Boise, Id.

[21] Appl. No.: 452,993

[22] Filed: May 30, 1995

[51] Int. Cl.$^6$ ........................................ G03F 7/20
[52] U.S. Cl. .................... 430/394; 430/396; 430/313
[58] Field of Search ................................ 430/311, 313, 430/314, 315, 323, 324, 394, 396, 397

[56] References Cited

U.S. PATENT DOCUMENTS

| | | | |
|---|---|---|---|
| 3,665,241 | 5/1972 | Spindt et al. | 313/351 |
| 3,755,704 | 8/1973 | Spindt et al. | 313/309 |
| 3,812,559 | 5/1974 | Spindt et al. | 29/25.18 |
| 5,045,417 | 9/1991 | Okamoto | 430/5 |
| 5,079,113 | 1/1992 | Ohta et al. | 430/5 |
| 5,126,220 | 6/1992 | Tokitomo et al. | 430/5 |
| 5,194,344 | 3/1993 | Cathey et al. | 430/5 |
| 5,194,345 | 3/1993 | Rolfson et al. | 430/5 |
| 5,194,346 | 3/1993 | Rolfson et al. | 430/5 |
| 5,208,125 | 5/1993 | Lowrey et al. | 430/5 |
| 5,217,830 | 6/1993 | Lowrey | 430/5 |
| 5,240,796 | 8/1993 | Lee et al. | 430/5 |
| 5,255,035 | 10/1993 | Rolfson | 156/643 |
| 5,281,500 | 1/1994 | Cathey et al. | 430/5 |
| 5,288,568 | 2/1994 | Cathey, Jr. | 430/5 |
| 5,290,647 | 3/1994 | Miyazaki et al. | 430/5 |
| 5,302,238 | 4/1994 | Roe et al. | 156/643 |
| 5,308,741 | 5/1994 | Kemp | 430/312 |
| 5,316,878 | 5/1994 | Saito et al. | 430/5 |
| 5,318,868 | 6/1994 | Hasegawa et al. | 430/5 |
| 5,324,600 | 6/1994 | Jinbo et al. | 430/5 |
| 5,328,807 | 7/1994 | Tanaka | 430/396 |
| 5,382,483 | 1/1995 | Young | 430/5 |
| 5,439,764 | 8/1995 | Alter et al. | 430/5 |

OTHER PUBLICATIONS

Lin, Burn J., "Phase Shifting and Other Challenges in Optical Mask Technology", IBM–EF–15 (Sep. 26, 1990).

Yen, Anthony et al., "Archromatic holographic configuration for 100–nm–period lithography", Applied Optics, vol. 31, No. 22, Aug. 1, 1992, pp. 4540–4545.

Jinbo et al., IEEE, "0.2um or Less i–Line Lithography by Phase–Shifting–Mask Technology", IEDM 90–825, pp. 33.3.1–33.3.4, 1990.

*Primary Examiner*—Kathleen Duda
*Attorney, Agent, or Firm*—Stephen A. Gratton

[57] ABSTRACT

A method of phase shift lithography includes forming a chromeless phase shift reticle with a pattern of parallel, spaced phase shifters. The phase shift reticle is placed between an exposure source (e.g., UV light) and a substrate having a layer resist formed thereon. Following an initial exposure, the phase shift reticle is rotated and the substrate is exposed a second time. The resist is then developed to form features in areas of resist that have not been exposed. These areas correspond to the projected points of intersection of the phase shifters. Using a positive tone resist, solid resist features are formed. These solid features can be used as mask blocks for etching the substrate to form field emitter sites for a field emission display. Using a negative tone resist, open areas are formed in the resist and can be used to deposit a material on the substrate such as a contacts for a semiconductor structure. The method of the invention can also be implemented using two different reticles with intersecting patterns or using a single reticle having intersecting phase shift areas.

16 Claims, 6 Drawing Sheets

METHOD OF PHASE SHIFT LITHOGRAPHY

FIELD OF THE INVENTION

This invention relates generally to photolithography and more particularly to photolithography using phase shifting. The method of the invention can be used in the formation of microelectronic components such as semiconductor devices and emitter sites for field emission displays.

BACKGROUND OF THE INVENTION

In photolithography, an exposure energy, such as ultraviolet light, is passed through a reticle or mask and onto a target such as a semiconductor wafer. The reticle contains opaque and transparent regions formed in a predetermined pattern. The exposure energy exposes the reticle pattern on a layer of resist formed on the target. The resist is then developed for removing either the exposed portions of resist for a positive resist or the unexposed portions of resist for a negative resist. The patterned resist can then be used during a subsequent fabrication process such as deposition, etching or ion implantation.

One technique used in photolithography is known as phase shift lithography. With phase shift lithography, the interference between waves of an exposure energy is used to overcome diffraction and improve the resolution and depth of optical images projected onto the target. In phase shift lithography, the phase of the exposure energy at the target is controlled such that adjacent bright areas are formed preferably 180 degrees out of phase with one another. Dark regions are thus produced between the bright areas by destructive interference. This technique improves total resolution at the target and allows resolutions as fine as 0.25 μm to occur.

In the past, phase shift reticles have been used experimentally to print sub micron features. However, phase shift lithography is still in research and development stages and has not been used extensively for commercial volume manufacturing. One reason phase shift lithography is not widely used commercially, is the high defect density which results during its use. Any defects on the reticle can be printed onto the target and reticles are difficult to form without defects.

One other shortcoming of phase shift lithography and photolithography in general, is that targets having large surface areas are difficult to accurately pattern. As an example, field emission displays (FEDs) used in the formation of flat panel displays, include display screens and other components that have a relatively large surface area. In general, the exposure tools and alignment fixtures used for patterning large areas do not produce as fine a resolution as with a smaller target, such as a wafer. It would be advantageous to use photolithography and particularly phase shift lithography in patterning large area targets.

One type of phase shift reticle is referred to as a chromeless reticle. A chromeless reticle does not include opaque (e.g., chrome) areas to convey a pattern. Rather, in a chromeless phase shift reticle, phase shifters can be formed by areas of a transparent substrate having an increased thickness relative to light transmission areas of the substrate. These areas of increased thickness can be formed using a subtractive process wherein the substrate is etched or using an additive process wherein a phase shift material is added. With a chromeless reticle, the exposure energy passing through a phase shifter must travel a greater distance through the substrate and is therefore phase shifted relative to exposure energy passing through an adjacent light transmission area.

With a chromeless phase shifting reticle, the pattern is carried by the edge of the phase shifters which prints a narrow dark line or null on the target. The amplitude of the electric field passing through zero insures a zero intensity at the target. The dark lines formed at the target are extremely narrow and have a much higher contrast in comparison to dark lines produced by a narrow opaque object without phase shifting.

The present invention is directed to an improved method of phase shift lithography in which image resolution in two directions can be controlled (e.g., x and y directions). This enables small features to be formed with both a sub-micron width and length. In addition, the present invention provides an improved method of phase shift lithography in which defects are minimized. Furthermore, the method of the invention allows large surface areas to be patterned with a high resolution.

OBJECTS OF THE INVENTION

Accordingly, it is an object of the present invention to provide an improved method of phase shift lithography.

It is another object of the present invention to provide an improved method of phase shift lithography in which image defects are minimized and image resolution is improved.

It is yet another object of the present invention to provide an improved method of phase shift lithography that is suitable for patterning large surface area targets.

It is yet another object of the present invention to provide an improved method for forming microelectronic components such as semiconductor devices, field emitter sites and Spindt cathodes for field emission displays (FEDs), utilizing phase shift lithography.

SUMMARY OF THE INVENTION

In accordance with the present invention, an improved method of phase shift lithography is provided. The method includes forming a chromeless phase shift reticle with a pattern of parallel, spaced phase shifters and forming a target with a layer of resist. An exposure energy such as a UV light is directed through the reticle to expose the reticle pattern on the resist. The reticle is then rotated through a desired angle and the resist is exposed again. This results in the resist being double exposed in some areas. Conversely the resist is unexposed in areas corresponding to the projected intersection points of the phase shifters. The features formed on the resist correspond to the projected intersection points and print as circles having a small area.

With the present method, the location and size of the features in the resist are defined by the projected intersection of the phase shifters rather than solely by the reticle pattern. This reduces the number of reticle pattern defects printed on the target because defects are less likely to occur at points of intersection. Furthermore, a high feature resolution across a large surface area can be effected because a spacing between the phase shifters is a determining factor in forming the printed pattern. This spacing can be accurately maintained even over a large surface area.

The method of the invention can be used with a positive tone resist to form a photomask having a pattern of solid areas (i.e., islands) with a very small surface area. These solid areas can be used directly or to form a hard mask for microelectronic processes such as etching, deposition and ion implantation. One application of the method using a positive tone resist is in forming field emitter sites for a field emission display.

The method of the invention can also be used with a negative tone resist to form a photomask with a pattern of open areas. These open areas have a very small surface area which can also be used for processes such as etching, ion implantation or deposition. One application of the method using a negative tone resist is in forming contacts for a semiconductor structure. Another application is in etching openings for emitter tips of a Spindt cathode field emitter.

The method of the invention, simply stated, includes the steps of: forming a chromeless phase shift reticle with a pattern of parallel, spaced, elongated phase shifters; exposing a layer of resist on a target using the reticle; rotating the reticle about an axis; exposing the resist a second time using the rotated reticle to form features on the target at the projected points of intersection of the phase shifters; and then developing the exposed resist.

The method of the invention can also be implemented with multiple chromeless phase shift reticles and a single exposure step using a perfectly collimated exposure energy such as a laser beam. In this case the reticles would be formed and juxtaposed to project an intersecting pattern on the target. In a similar manner a single reticle having differently patterned areas formed to project an intersecting pattern on the target can be used.

DETAILED DESCRIPTION OF THE PREFERRED EMBODIMENT

As used herein the term "reticle" refers to a "mask" that can be used to form a pattern of features on a target using photolithography. The reticle can be used directly to project a pattern onto the substrate. Alternately "working masks" can be made from the reticle, by printing or other techniques, and these working masks can be used during the actual photolithographic process. The terms resist and photoresist are used interchangeably.

Figure 1A:
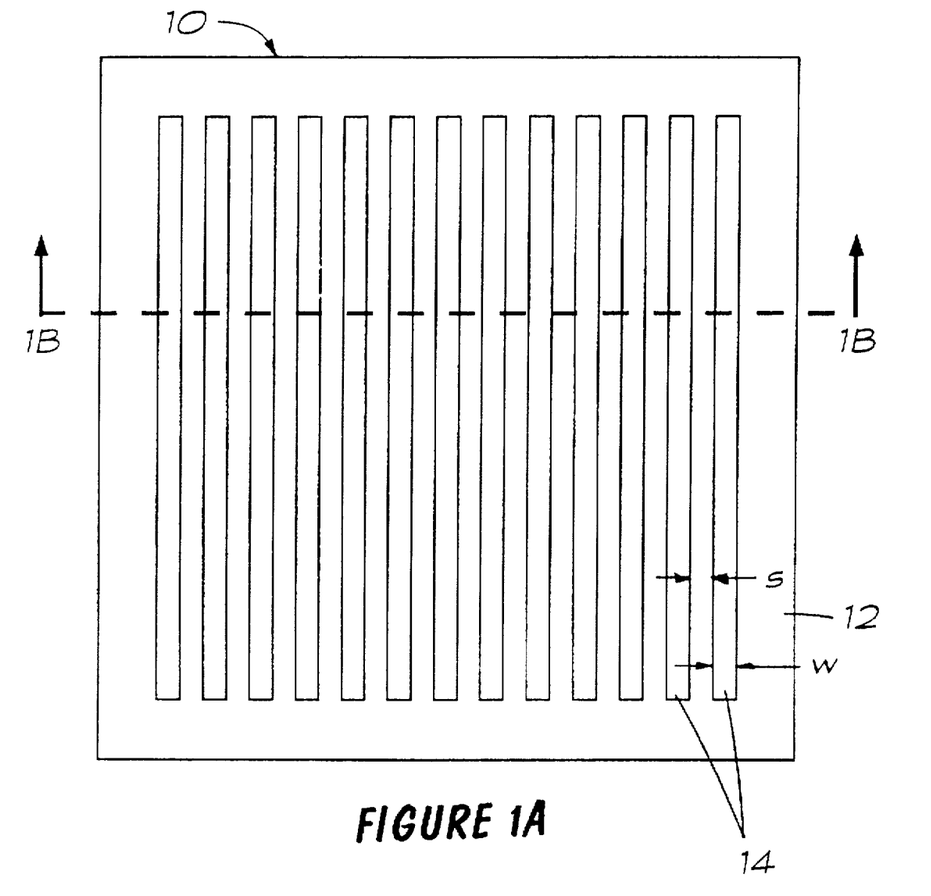
FIG. 1A is a schematic plan view of a chromeless phase shift reticle.
Figure 1B:
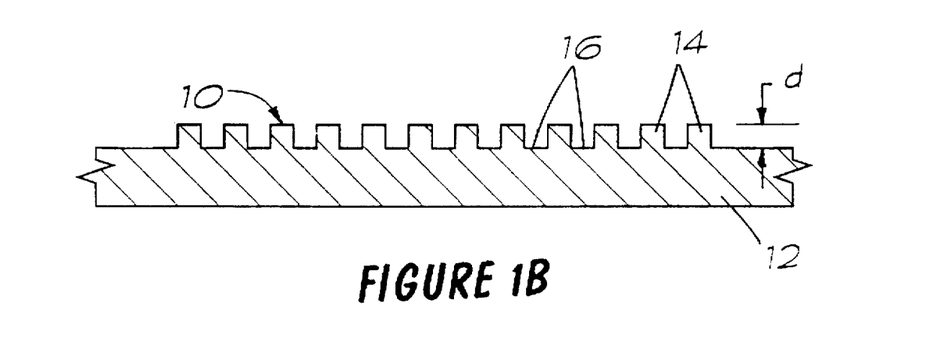
FIG. 1B is a cross section taken along section line 1B—1B of FIG. 1A.

Referring now to FIGS. 1A and 1B, a chromeless phase shift reticle 10 is shown. The reticle 10 includes a transparent substrate 12. The transparent substrate 12 is formed of a material, such as polished quartz, that is transparent to light or other exposure energy (e.g., x-ray, electron beam) at an exposure wavelength (e.g., UV). The substrate 12 is etched to form a pattern of raised phase shifters 14 each having a width of "w". The phase shifters 14 are elongated, or linear, structures that are formed parallel to one another and equally spaced by a spacing of "s". The pattern of phase shifters 14 can be formed using a subtractive process by anisotropically etching the substrate 12 to form grooves 16 into the substrate 12 to a depth of "d" (FIG. 1B). The substrate 12 can be etched using a suitable dry etchant. Suitable dry etchants for a substrate 12 formed of quartz include fluorine based etchants such as $SF_6$, $CF_4$ and $CHF_3$.

The depth d is selected such that the phase shifters 14 preferably produce a phase shift of 180° ($\pi$), or odd integral multiple thereof, for light passing through the phase shifters 14 relative to light passing through the grooves 16.

A value for the depth d can be determined by the well known formula $$d = \lambda/2(n-1)$$

where d=depth of the grooves i=an odd integral $\lambda$=wavelength of exposure light n=refractive index of phase shift material at the exposure wavelength.

Elongated phase shifters can also be formed using an additive process. In addition, a method for forming a chromeless phase shift reticle is described in U.S. Pat. No. 5,240,796 entitled "Method of Fabricating A Chromeless Phase Shift Reticle", which is incorporated herein by reference.

Figure 2:
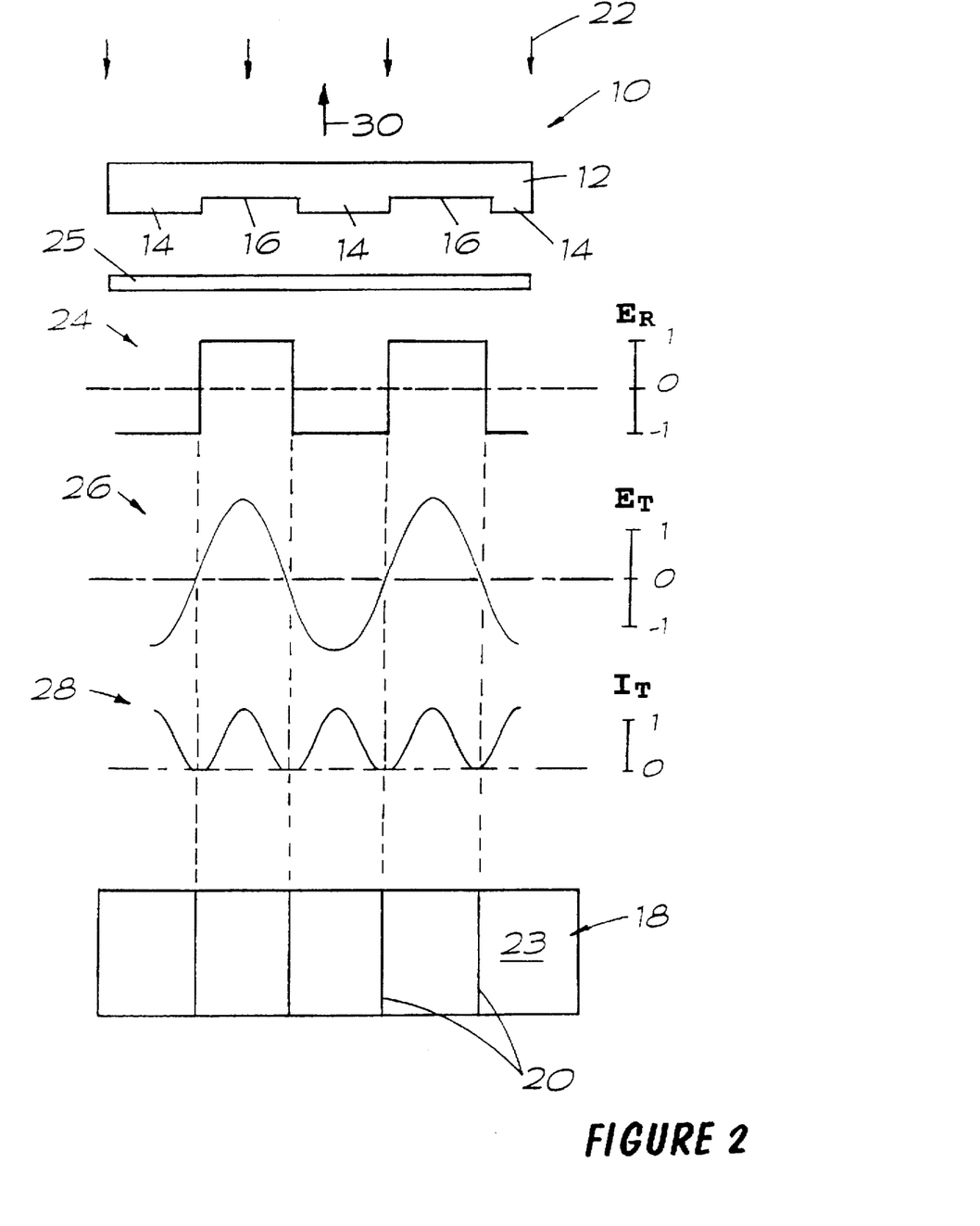
FIG. 2 is a schematic view illustrating operational characteristics of the phase shift reticle shown in FIG. 1A and an exposure pattern formed on a target.

With reference to FIG. 2, the chromeless phase shift reticle 10 can be used to pattern a target 18 with a pattern of dark lines 20. Exposure energy 22, such as UV light, is directed through the reticle 10 and through a lens system 25 to the target 18. The exposure energy 22 is collimated and travels along a path that is coincident to axis 30. The target 18 is coated with a layer of photoresist 23 which is exposed by the exposure energy 22. The exposed photoresist 23 is subsequently developed for removing either the exposed portions of the photoresist 23 for a positive resist or the unexposed portions of resist for a negative resist.

As shown by graph 24, the electric field on the reticle (Er) 10 is stepped 180° ($\pi$) out of phase by each phase shifters 14. As shown by graph 26, the electric field on the target (Et) 18 has a sinusoidal distribution, varying in amplitude from 1 to −1. As shown by graph 28, the intensity at the target 18 (It) has a sinusoidal distribution with a pattern of zero intensities aligned with the edges of the phase shift lines 14. This intensity distribution at the target 18 is caused by the phase canceling of light passing through the phase shift lines 14 relative to light passing through the grooves 16. The maximum phase canceling occurs at the edges of the phase shift lines 14 which correspond to areas of zero intensity at the target 18.

Figure 3A:
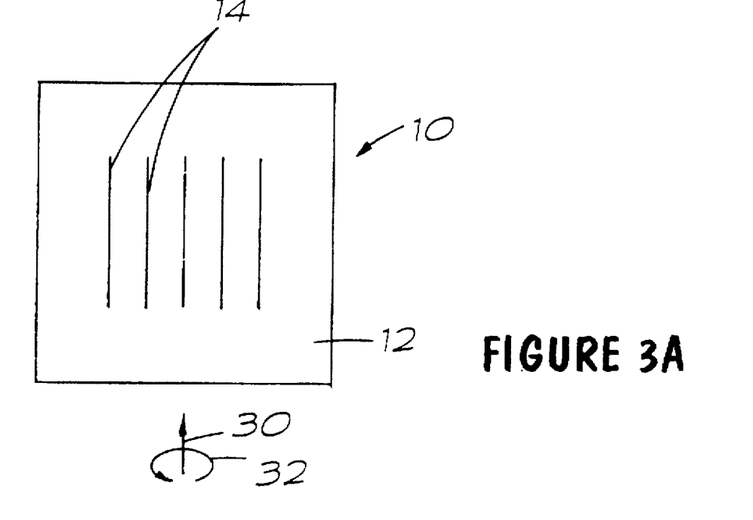
FIGS. 3A–3C are schematic plan views of a reticle pattern achieved by rotating the reticle in FIG. 1A about an axis coincident to the path of the exposure radiation and through an angle of 90°.
Figure 3B:
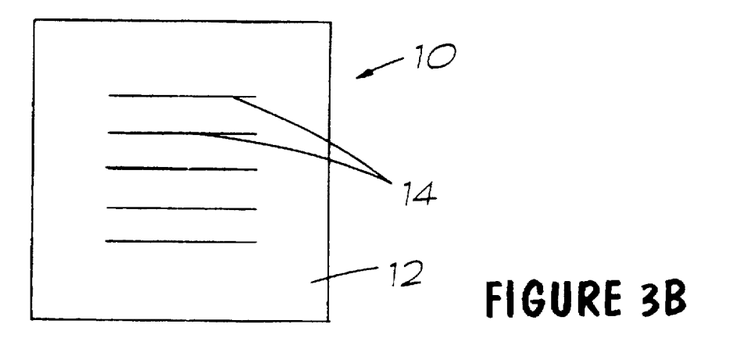
Figure 3C:
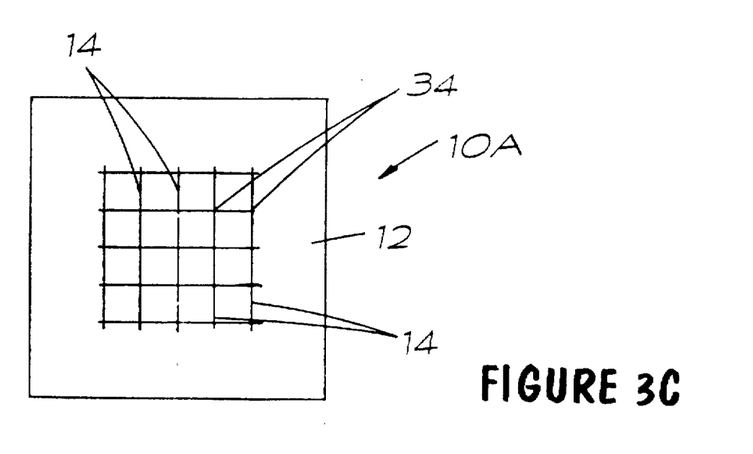

With reference to FIGS. 3A–3C, an exposure process using the chromeless phase shift reticle 10 is shown. Initially, as shown in FIG. 3A, the resist 23 on the target 18 (FIG. 2) is exposed using a first exposure step and reticle 10 orientation. Next, as represented by rotational arrow 32 in FIG. 3B the phase shift reticle 10 is rotated. Preferably the phase shift reticle is rotated about an axis 30 which is coincident to a path of the exposure energy 22. Using this rotated reticle position, the target 18 is exposed again. In this example, the amount of angular rotation about the axis 30 is 90°. A 90° angular rotation will produce a pattern of printed features that are equally spaced in a vertical and a horizontal direction. However, any amount of rotation that will cause points of intersection to be projected onto the target 18 during a subsequent exposure step can be utilized. Rotational amounts other than 90° will produce a spacing that is different in the x and y directions for the features subsequently formed at the target 18. In general, the amount of rotation can be at any angle between 0° to 360° but with 0°, 180° and 360° excluded.

Figure 4:
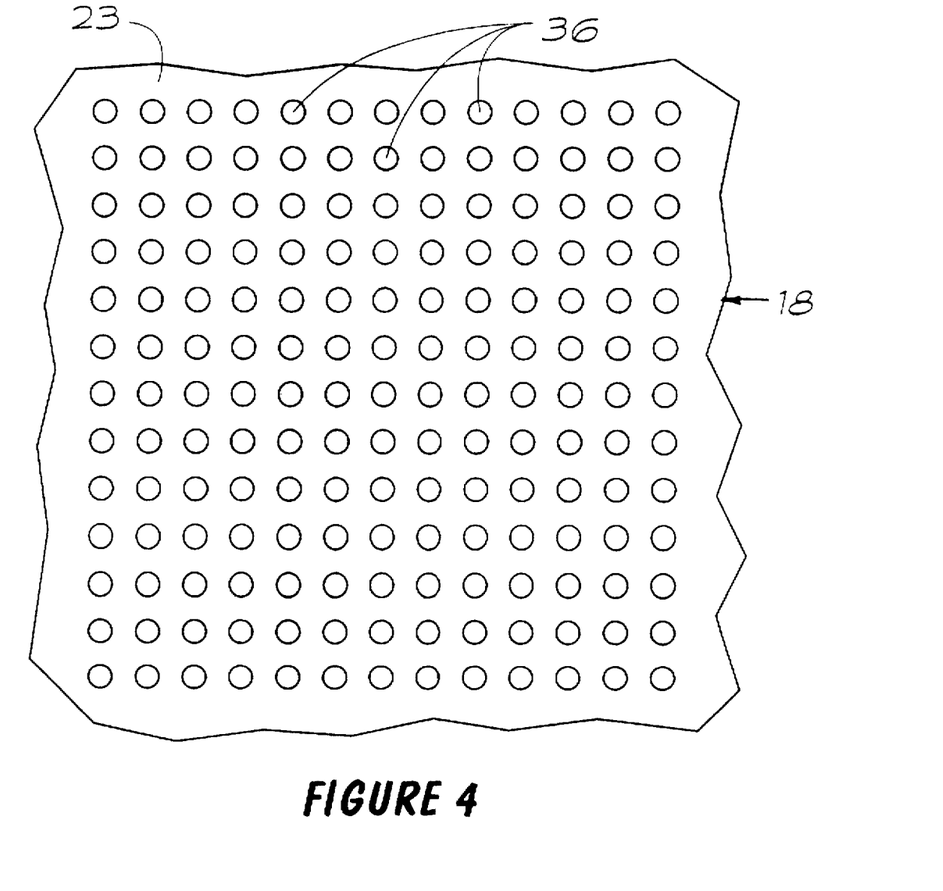
FIG. 4 is a schematic plan view of an exposure pattern formed at a target using the reticle pattern shown in FIG. 3.

A double exposure with a 90° rotation of the reticle 10 projects the reticle pattern 10A onto the target 18 depicted in FIG. 3A. Alternately this same pattern can be formed with a chromeless phase shift reticle pattern from a second reticle, or from another location on the first reticle, which intersects the first exposure pattern. The points of intersection 34 in the projected reticle pattern 10A correspond to areas on the target 18 that are not exposed. The resultant exposure pattern at the target 18 is shown in FIG. 4. In FIG. 4, the features 36 printed on the photoresist 23 correspond to the projection of the points of intersection 34 of the projected reticle pattern 10A (FIG. 3C).

However, with the intersecting pattern technique, the features 36 do not print as points. Rather, due to the point spread function and imperfections in the lens system 25 (FIG. 2) the printed features 36 have a generally circular peripheral configuration. Advantageously, this circular peripheral area can be made with a sub micron diameter.

Following the exposure process illustrated in FIGS. 3A-3C, the photoresist 23 is developed using a suitable developer. Only one development step is required. For a positive tone photoresist development results in the dissolution of the exposed photoresist but does not affect the unexposed photoresist. For a positive tone photoresist the features 36 (FIG. 4) develop as solid areas or islands. For a negative tone photoresist, the development results in the dissolution of the unexposed photoresist but does not affect the exposed photoresist. For a negative tone photoresist the features 36 (FIG. 4) develop as holes or openings.

One aspect of the present method is that printed defects are minimized. Defects on the reticle 10 include pinholes, spots, intrusions, and protrusions. With the method of the invention, most reticle defects will not print on the photoresist 23. Only the projected intersection points 34 of the phase shifters 14 will print on the photoresist 23. It is less likely that a defect will occur at these intersection points. In addition, targets 18 having a large surface area can be printed because a uniform pattern of features 36 can be maintained over a large area. The spacing of the phase shift lines 14 is a primary factor in forming the pattern. This allows targets having a diagonal dimension on the order of 9 inches to 15 inches or greater to be patterned.

Figure 5A:
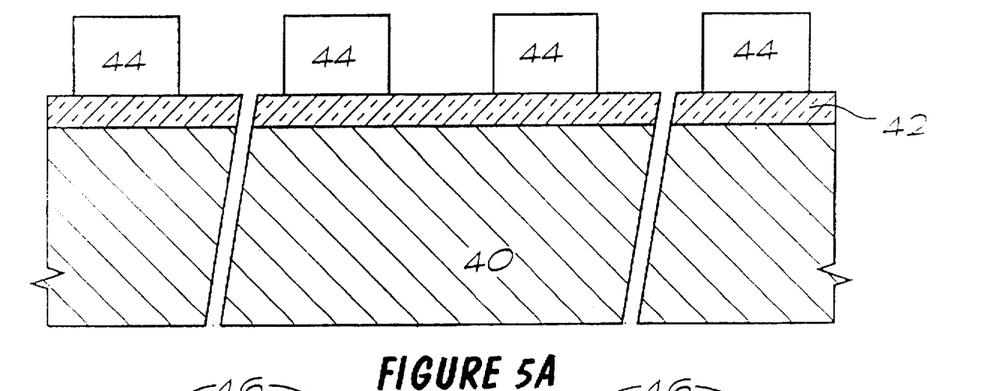
FIGS. 5A–5D are schematic cross sectional views illustrating steps in forming emitter sites of a field emission display using the method of the invention.
Figure 5B:
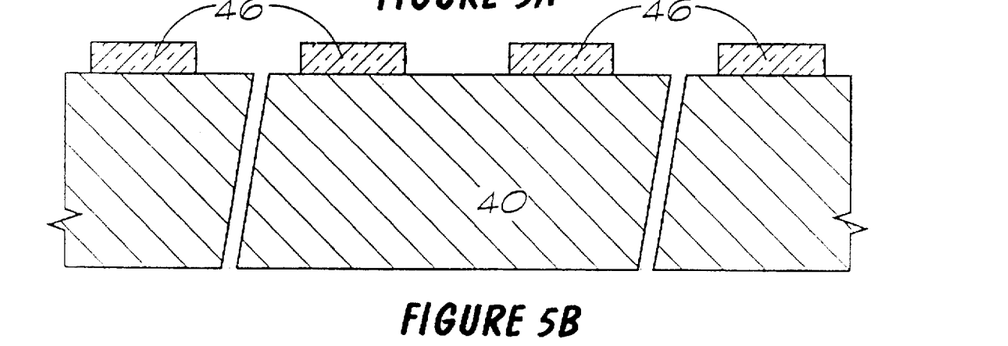
Figure 5C:
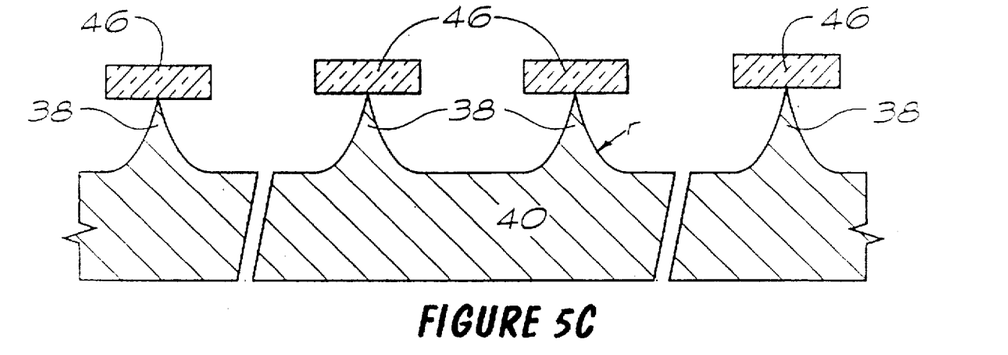

Referring now to FIGS. 5A-5C, a specific application for the method of the invention is illustrated. In FIGS. 5A-5C the method is used to form emitter sites 38 (FIG. 5C) for a field emission display. U.S. Pat. No. 5,302,238 to Roe et al.; U.S. Pat. No. 5,210,472 to Casper et al.; U.S. Pat. No. 5,232,549 to Cathey et al.; U.S. Pat. No. 5,205,770 to Lowrey et al.; U.S. Pat. No. 5,186,670 to Doan et al.; and U.S. Pat. No. 5,229,331 to Doan et al.; all of which are incorporated by reference, disclose methods for forming various elements of field emission displays.

In FIG. 5A, a cathodic baseplate 40 for a field emission display is formed. The baseplate 40 can be formed of a material such as single crystal silicon. Other materials such as amorphous silicon deposited on a glass substrate can also be utilized. The baseplate 40 contains circuitry and electrical devices (not shown) which control the operation of the field emission display. For etching field emitter sites 38 (FIG. 3C) for the baseplate 40, a mask layer 42 is deposited on the baseplate 40. The mask layer 42 can be formed of an insulating material that can be etched selective to the baseplate 40. The preferred material is an oxide such as silicon dioxide or silicon nitride. The mask layer 42 can be deposited using a suitable deposition technique (e.g., CVD). A typical thickness for the mask layer 42 is about 500 Å to 3000 Å.

A layer of positive tone photoresist 44 is deposited on the mask layer 42. The layer of photoresist 44 can be deposited using a spin on process and then soft baked to drive out solvents. A typical thickness for the photoresist 44 is about 10,000 Å to 15,000 Å. The photoresist 44 is then exposed and developed using the method of the invention as previously explained. Development of the positive tone photoresist 44 results in the dissolution of the exposed photoresist. With a positive tone photoresist 44, the solid areas of photoresist 44 in FIG. 5A correspond to the features 36 (FIG. 4) formed on the target 18.

Next, as shown in FIG. 5B, the photoresist 44 is used to etch the mask layer 42 to form a hard mask 46. Depending on the materials used for the mask layer 42, this etch step can be performed using a wet or dry etch. As an example, silicon nitride can be etched with an $SF_6$ based plasma etch. The solid areas of the mask layer 42 form mask blocks that can be made very small by the phase shift photolithography process. Specifically, the diameter of the mask blocks for the mask layer 42 can be formed with sub-micron dimensions.

Following formation of the hard mask 46, the photoresist 44 is stripped. For a positive tone photoresist a solution of concentrated $H_2SO_4$ and $H_2O_2$ at about 150° C. can be used. Such an etch is referred to in the art as a "piranha" etch.

Next, as shown in FIG. 5C, the baseplate 40 is etched using the hard mask 46 to form pointed emitter sites 38. By way of example an isotropic etch can be used to form the emitter sites 38. For an isotropic etch in which the etch rate is the same in all directions, an etchant solution containing a mixture of HF, $HNO_3$, and $H_2$ can be utilized. With an isotropic etch the sidewalls of the emitter sites 38 form with a radius of "r" and are undercut below the hard mask 46. The value of the radius "r" is controlled by the etch parameters (i.e., time, temperature, concentration of 5 etchant) and by the size of the solid areas of the hard mask 46.

Following formation of the emitter sites 38 the hard mask 46 is stripped using an etchant that is selective to the baseplate 40. A hard mask 46 formed of silicon nitride can be stripped using a wet etchant such as $H_3PO_4$.

Figure 5D:
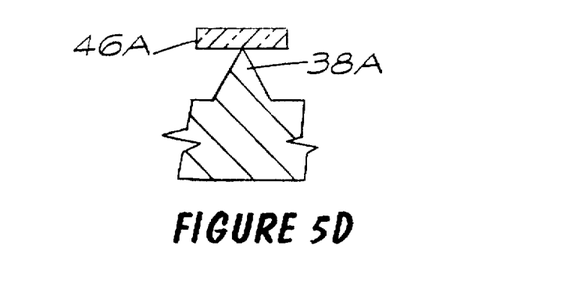

Alternately, as shown in FIG. 5D, the emitter sites 38A can be formed using an anisotropic etch. For an anisotropic etch, in which the etch rate is different in different directions, an etchant solution containing a mixture of KOH and $H_2O$ can be utilized. A dry etch process using $CL_2$ chemistries can also be used to anisotropically etch the emitter sites 38A. This results in the emitter sites 38A having sidewalls that are sloped at an angle of approximately 54° with the horizontal. The slope of the sidewalls is a function of the different etch rates of monocrystalline silicon along the different crystalline orientations. The surface of the baseplate 40 represents the <100> planes of the silicon which etches faster than the sloped sidewalls that represent the <111> planes.

With either the isotropic etch or the anisotropic etch the emitter sites 38 or 38A can be formed as elongated sharpened blades rather than as sharp points. Elongated blades can be formed by controlling the length and width of the solid portions of the hard mask 46. Additionally, in place of forming a hard mask 46 the photoresist 44 can be used directly to etch the substrate 40.

Figure 6A:
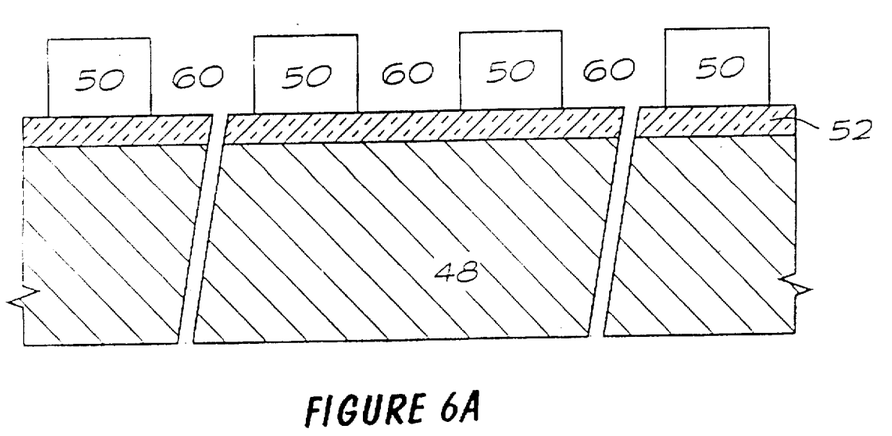
FIGS. 6A–6C are schematic cross sectional views illustrating steps in forming contact vias and contacts of a semiconductor structure using the method of the invention.
Figure 6B:
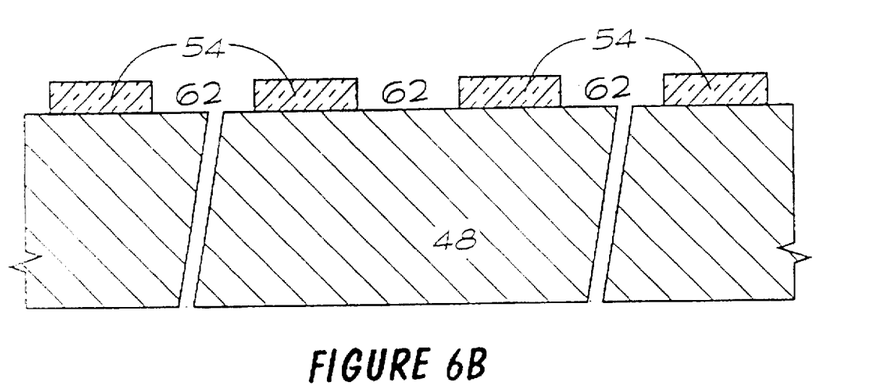
Figure 6C:
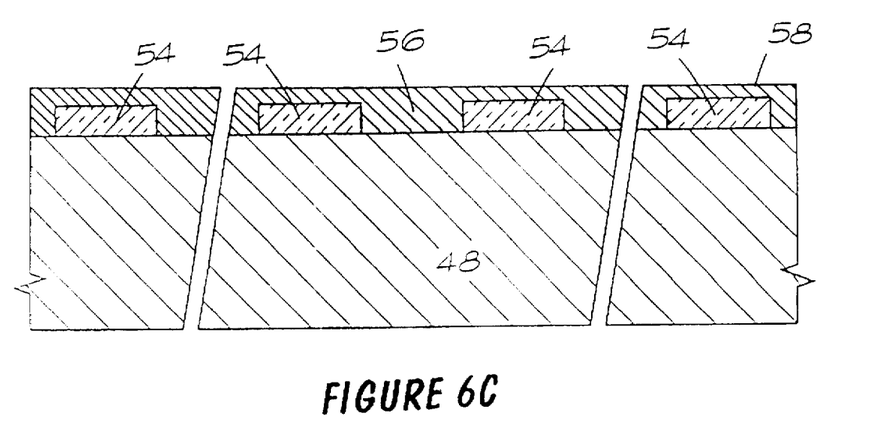

Referring now to FIGS. 6A-6C, the method of the invention is illustrated for forming contacts 56 (FIG. 6C) on a semiconducting substrate 48. The semiconducting substrate 48 is illustrated in simplified form and includes various integrated circuitry formed thereon. Initially an insulating layer 52 is deposited on the substrate 48. The insulating layer 52 can be formed of an insulating material that can be etched selective to the substrate 48. The preferred material is an oxide such as silicon dioxide or silicon nitride. The insulating layer 52 can be deposited using a suitable deposition technique (e.g., CVD). A typical thickness for the insulating layer 52 is about 500 Å to 3000 Å.

Next, a layer of negative tone photoresist 50 is deposited on the insulating layer 52. The layer of photoresist 50 can be deposited using a spin on process and then soft baked to drive out solvents. A typical thickness for the photoresist 50 is about 10,000 Å to 15,000 Å. The photoresist 50 is then exposed and developed using the method of the invention. Using the method of the invention the photoresist 50 is not exposed in areas corresponding to the projected points of intersection 34 (FIG. 3) on the reticles 10.

As previously explained, the projected points of intersection 34 can be formed by rotating a reticle about an axis of the exposure energy. The projected points of intersection 34 can also be formed using multiple reticles and a perfectly collimated exposure source such as a laser beam. In this case the reticles could be juxtaposed such as shown in FIG. 3A and 3B to form the combined reticle pattern 10A shown in FIG. 3C. Furthermore, the same result could be achieved by intersecting patterns formed on different locations of a single reticle. For a negative tone photoresist 50 development of the unexposed portions results in the formation of open areas 60 (FIG. 6A). Using the method of the invention these open areas 60 can be made very small (i.e., submicron).

Next, as shown in FIG. 6B, the photoresist 50 is used to etch the insulating layer 52 to form an insulating mask 54 with contact vias 62. Depending on the materials used for the insulating layer 52, this etch step can be performed using a wet or dry etch. As an example, silicon nitride can be etched with a suitable dry etchant. Following formation of the insulating mask 54, the photoresist 50 is then stripped using a piranha etch as previously described.

Next, as shown in FIG. 6C, a conductive material such as aluminum, titanium or tungsten is deposited over the insulating mask 54 and into the contact vias 62 to form contacts 56. The contacts 56 can be formed of a single material or as a stack of materials. A conductive trace 58 can be formed in electrical communication with the contacts 56 at the same time. The conductive trace 58 can be formed of a same material as the contacts 56 or out of a different conductive material.

A negative tone photoresist can also be employed to form holes useful for forming field emission cathode structures known in the art as Spindt cathodes. U.S. Pat. No. 3,755,704 to Spindt et al., incorporated herein by reference, describes Spindt cathodes and methods for forming these structures. This type of Spindt cathode structure requires openings for needle like emitter sites formed on a substrate. The openings must be etched through various layers of material that have been deposited on the substrate. In this case a negative tone photoresist double exposed in accordance with the invention can be used to form a mask with open areas 60 as shown in FIG. 6A. These open areas 60 can then be used to etch openings for the emitter sites. A similar process can be used to form an active matrix liquid crystal display.

Thus the invention provides an improved method of phase shift lithography. While the invention has been described with reference to certain preferred embodiments, as will be apparent to those skilled in the art, certain changes and modifications can be made without departing from the scope of the invention as defined by the following claims.

What is claimed is:

1. A method of phase shift lithography comprising:
   providing a target with a layer of resist thereon;
   providing a first and a second chromeless phase shift pattern on a same reticle, said first and second patterns comprising parallel spaced phase shifters formed to project an intersecting pattern on the target;
   directing an exposure energy through the first pattern to form an exposure pattern on the resist;
   moving the reticle or the target to align the second pattern with the exposure pattern;
   directing the exposure energy through the second pattern; and
   developing the resist to form features corresponding to selected areas of resist that remain unexposed.

2. The method as claimed in claim 1 wherein the resist comprises a positive tone resist and the features comprise resist islands.

3. The method as claimed in claim 1 wherein developing the resist forms a resist mask for etching the target.

4. The method as claimed in claim 3 further comprising etching the target using the resist mask to form field emitter sites for a field emission display.

5. The method as claimed in claim 1 wherein the resist comprises a negative tone resist and the features comprise open areas.

6. The method as claimed in claim 1 wherein developing the resist forms a resist mask for depositing a material onto the target.

7. The method as claimed in claim 6 wherein depositing the material forms contacts for a semiconductor device.

8. The method as claimed in claim 1 wherein the features are generally circular in shape.

9. The method as claimed in claim 1 wherein developing the resist forms a resist mask for etching the target to form openings for a Spindt cathode.

10. A method of phase shift lithography comprising:
    providing a target with a layer of resist thereon;
    providing a chromeless phase shift reticle comprising first and second phase shift regions formed to project an intersecting pattern on the target;
    directing an exposure energy through the first phase shift region to form an exposure pattern on the resist;
    moving the target or the reticle to align the second phase shift region with the exposure pattern;
    directing exposure energy through the second phase shift region; and
    developing the resist to form features corresponding to areas unexposed by the exposure energy passing through the first and second phase shift regions.

11. The method as claimed in claim 10 wherein the resist comprises a positive tone resist and the features comprise resist islands.

12. The method as claimed in claim 10 wherein the resist comprises a negative tone resist and the features comprise openings in the resist.

13. The method as claimed in claim 10 wherein the target comprises a baseplate of a field emission display.

14. The method as claimed in claim 10 wherein the target comprises a semiconducting substrate.

15. The method as claimed in claim 10 wherein the features are generally circular in shape.

16. The method as claimed in claim 10 wherein the features are generally circular in shape with a sub micron diameter.

* * * * *